(12) United States Patent
Rofougaran

(10) Patent No.: US 8,319,578 B2
(45) Date of Patent: *Nov. 27, 2012

(54) METHOD AND SYSTEM FOR CONFIGURABLE DIFFERENTIAL OR SINGLE-ENDED SIGNALING IN AN INTEGRATED CIRCUIT

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/306,555

(22) Filed: Nov. 29, 2011

(65) Prior Publication Data

US 2012/0068782 A1  Mar. 22, 2012

Related U.S. Application Data

(63) Continuation of application No. 12/056,525, filed on Mar. 27, 2008, now Pat. No. 8,072,287.

(51) Int. Cl.
*H03H 7/42* (2006.01)
*H01P 1/10* (2006.01)

(52) U.S. Cl. .......................................... 333/25; 333/101

(58) Field of Classification Search .................... 333/25, 333/26, 238, 101, 103
See application file for complete search history.

(56) References Cited

U.S. PATENT DOCUMENTS

| | | | |
|---|---|---|---|
| 5,015,972 A * | 5/1991 | Cygan et al. | 333/32 |
| 6,603,383 B2 * | 8/2003 | Gevorgian et al. | 336/200 |
| 6,982,609 B1 * | 1/2006 | McKay et al. | 333/25 |
| 7,269,391 B2 * | 9/2007 | Chiu et al. | 455/83 |
| 7,859,359 B2 * | 12/2010 | Rofougaran | 333/25 |
| 8,072,287 B2 * | 12/2011 | Rofougaran | 333/25 |

* cited by examiner

*Primary Examiner* — Dean O Takaoka
(74) *Attorney, Agent, or Firm* — Farjami & Farjami LLP

(57) ABSTRACT

Aspects of a method and system for configurable differential or single-ended signaling in an integrated circuit. In this regard, a balun comprising one or more loops fabricated in a plurality of metal layers in an integrated circuit may enable conversion between unbalanced and balanced signals. In this regard, balanced signal output by a power amplifier may be converted to a balanced signal for transmission via an antenna. Similarly, an unbalanced signal received by an antenna may be converted to a balanced signal for amplification by an amplifier with a balanced input. The loops may be fabricated in transmission line media such as microstrip and/or stripline. The loops may comprise ferromagnetic material which may be deposited on and/or within the IC. Signals converted via the balun may be in the 61 GHz-61.5 GHz ISM band.

20 Claims, 5 Drawing Sheets

METHOD AND SYSTEM FOR CONFIGURABLE DIFFERENTIAL OR SINGLE-ENDED SIGNALING IN AN INTEGRATED CIRCUIT

CROSS-REFERENCE TO RELATED APPLICATIONS/INCORPORATION BY REFERENCE

This patent application is a continuation of U.S. application Ser. No. 12/056,525, filed Mar. 27, 2008, which is incorporated herein in its entirety for all purposes.

FIELD OF THE INVENTION

Certain embodiments of the invention relate to signal processing. More specifically, certain embodiments of the invention relate to a method and system for configurable differential or single-ended signaling in an integrated circuit.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices smaller and lighter. In this regard, designers find themselves in a never ending quest to include more functionality in less space. However, shrinking device and technology sizes leads to a multitude of design issues.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for configurable differential or single-ended signaling in an integrated circuit, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for configurable differential or single-ended signaling in an integrated circuit. In this regard, a balun comprising one or more loops fabricated in a plurality of metal layers in an integrated circuit may enable conversion between unbalanced and balanced signals. In this regard, balanced signal output by a power amplifier may be converted to a balanced signal for transmission via an antenna. Similarly, an unbalanced signal received by an antenna may be converted to a balanced signal for amplification by an amplifier with a balanced input. The loops may be fabricated in transmission line media such as microstrip and/or stripline. The loops may comprise ferromagnetic material which may be deposited on and/or within the IC. Signals converted via the balun may be in the 61 GHz-61.5 GHz ISM band.

Figure 1:
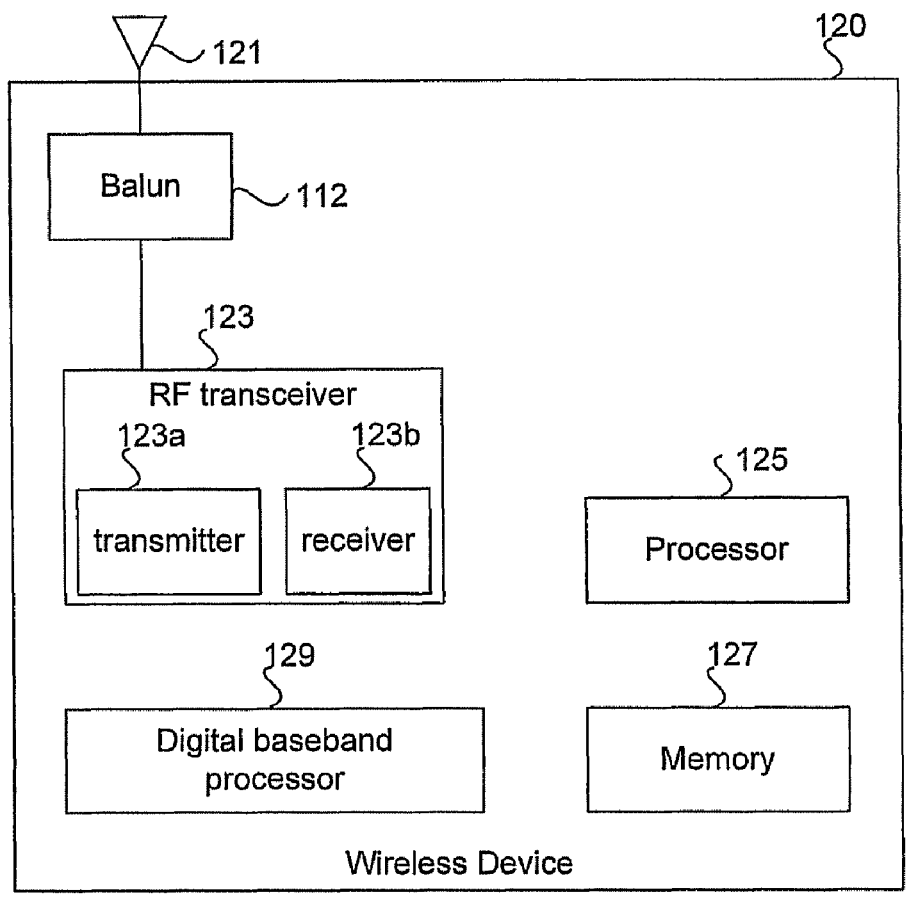
FIG. 1 is a block diagram illustrating an exemplary wireless device, in accordance with an embodiment of the invention.

FIG. 1 is a block diagram illustrating an exemplary wireless device, in accordance with an embodiment of the invention. Referring to FIG. 1, there is shown a wireless device 120 that may comprise an RF transceiver 123, a digital baseband processor 129, a processor 425, and a memory 127. The transceiver 123 may comprise a receiver 123a and a transmitter 123b. An antenna 121 may be communicatively coupled to the RF transceiver 123 via the balun 112. The wireless device 120 may be operated in a system, such as the cellular network and/or digital video broadcast network, for example.

In an exemplary embodiment of the invention, the antenna 121 may comprise one or more antenna elements which may be coupled and/or decoupled via one or more switching elements. In this regard, the antenna 121 may be configured based on factors comprising frequency, polarization, and/or gain. In another exemplary embodiment of the invention, the antenna 121 may be a phased array antenna. In this regard, the directivity of the antenna may be controlled by adjusting the phase(s) of signals communicatively coupled to the antenna.

The RF receiver 123a may comprise suitable logic, circuitry, and/or code that may enable processing of received RF signals. The RF receiver 123a may enable receiving RF signals in a plurality of frequency bands. For example, the RF receiver 123a may enable receiving signals in extremely high frequency (e.g., 60 GHz) bands. The receiver 123a may be enabled to receive, filter, amplify, down-convert, and/or perform analog to digital conversion. The RF receiver 123a may down convert a received RF signal. In this regard, the RF receiver 123a may perform direct down conversion of the received RF signal to a baseband or may convert the received RE signal to an intermediate frequency (IF). In various embodiments of the invention, the receiver 123a may perform quadrature down-conversion where in-phase components and quadrature phase components may be processed in parallel. The receiver 123a may be enabled to receive signals via the balun 112, which may be configurable and provide a means for converting between differential and single ended signaling. In various embodiments of the invention, the wireless device 120 may comprise a plurality of the receivers 123a and may thus support multiple frequency bands and or simultaneous reception of signals in the same frequency band.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. In this regard, the baseband processor 129 may provide one or more control signals for configuring the balun 112 via one or more switching elements. The digital baseband processor 129 may communicate information and/or data from the processed signals to the processor 425 and/or to the memory 127. Moreover, the digital baseband processor 129 may receive information from the processor 425 and/or to the memory 127, which may be processed and transferred to the RF transmitter 123b for transmission to the network.

The RF transmitter 123b may comprise suitable logic, circuitry, and/or code that may enable processing of RF signals for transmission. The transmitter 123b may be enabled to transmit signals via the balun 112, which may be configurable and provide a means for converting between single ended (unbalanced) and differential (balanced) signaling. The RF transmitter 123b may enable transmission of RF signals in a plurality of frequency bands. For example, the RF transmitter 123b may enable transmitting signals in cellular frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless device 120 may comprise more than one RF transmitter 123b, wherein each of the RF transmitters 123b may be a single-band or a multi-band transmitter.

In various embodiments of the invention, the RF transmitter 123b may perform direct up conversion of the baseband signal to an RF signal. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 425 may comprise suitable logic, circuitry, and/or code that may enable control and/or data processing operations for the wireless device 120. The processor 425 may be utilized to control at least a portion of the RF receiver 123a, the RF transmitter 123b, the digital baseband processor 129, and/or the memory 127. In this regard, the processor 425 may generate at least one signal for controlling operations within the wireless device 120. In this regard, the baseband processor 129 may provide one or more control signals for configuring the balun 112 via one or more switching elements. The processor 425 may also enable executing of applications that may be utilized by the wireless device 120. For example, the processor 425 may execute applications that may enable displaying and/or interacting with content received via cellular transmission signals in the wireless device 120.

The memory 127 may comprise suitable logic, circuitry, and/or code that may enable storage of data and/or other information utilized by the wireless device 120. For example, the memory 127 may be utilized for storing processed data generated by the digital baseband processor 129 and/or the processor 425. The memory 127 may also be utilized to store information, such as configuration information, that may be utilized to control the operation of at least one block in the wireless device 120. For example, the memory 127 may comprise information necessary to configure the balun 112. In this regard, the memory may store control and/or configuration information for configuring the windings ratio of the transformer 112 via one or more switching elements.

In operation, a wireless signal may be received via the antenna 121 and conveyed to the transceiver 123 via the balun 112 fabricated in one or more metal layers of an integrated circuit in the wireless device 120. In this regard, the balun may convert the unbalanced received signal from the antenna 121 to a balanced signal which may be processed by the transceiver. Similarly, a signal transmitted by transceiver 123 may be coupled to the antenna 121 via the balun 112 fabricated in one or more metal layers of an integrated circuit in the wireless device 120. In this regard, the balun 112 may convert a balanced signal output by a power amplifier in the transceiver 123 into an unbalanced signal for transmission via the antenna 121.

Figure 2:
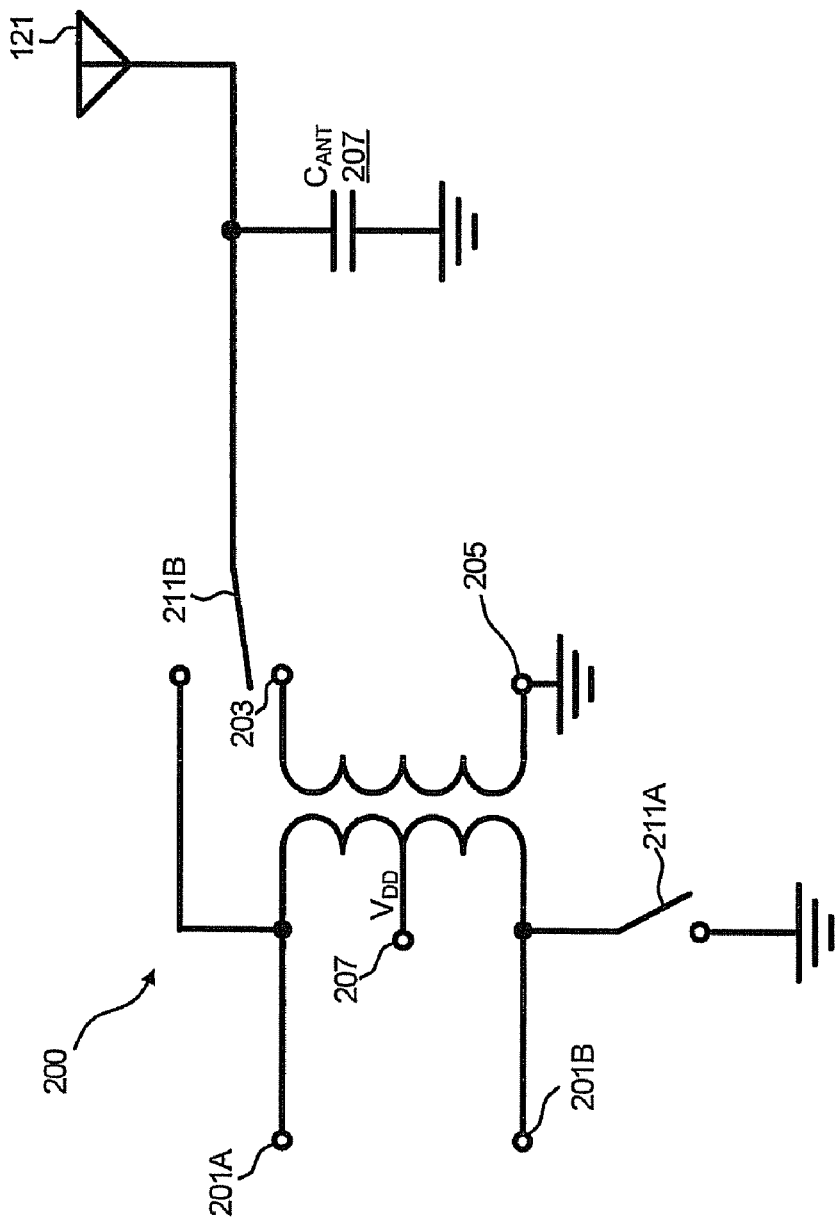
FIG. 2 is a diagram of an exemplary balun transformer, in accordance with an embodiment of the invention.

FIG. 2 is a diagram of an exemplary balun, in accordance with an embodiment of the invention. Referring to FIG. 2, there is shown a balun 200, an antenna capacitor 207, an antenna 121, and switches 211A and 211B. The balun 200 may comprise input terminals 201A and 201B, a DC bias tap 207, and output terminals 203 and 205.

The antenna 121 may be as described with respect to FIG. 1.

The antenna capacitor 207 may enable improved impedance matching between the antenna 121 and the output impedance of the power amplifier in the transceiver 152 described with respect to FIG. 1. The switches 211B and 211B may comprise microelectromechanical system (MEMS) switches or CMOS transistor switches on an integrated circuit, for example.

In operation, an RF signal to be transmitted may be communicated from a differential output power amplifier to the balanced inputs 201A and 201B of the balun 200. The unbalanced output signal may be communicated to the antenna 209 for transmission. In an embodiment of the invention, the antenna capacitor 207 may be configurable to adjust the impedance matching for different frequencies or different antennas in instances where more than one antenna may be utilized.

In an exemplary embodiment of the invention, an unbalanced signal suitable for transmission may be communicatively coupled to the terminal 201a. Accordingly, the switch 211B may be configured such that the input terminal 201a may be coupled to the antenna 121. Additionally the switch 211a may communicatively couple the terminal 201b to ground. In this manner, the balun 112 may be effectively bypassed.

In an exemplary embodiment of the invention, an unbalanced signal which may be unsuitable for transmission via the antenna 121 may be communicatively coupled to the input terminal 201a. Accordingly, the switch 211a may communicatively couple the input terminal 201b to ground and the switch 211b may communicatively couple the output terminal 203 to the antenna 121. In this manner, the balun 112 may provide impedance matching and/or otherwise condition the unbalanced signal for transmission via the antenna 121.

In an exemplary embodiment of the invention, a balanced signal may be communicatively coupled to the input terminals 201. Accordingly, the switch 211a may be open and the switch 211b may communicatively couple the output terminal 203 to the antenna 121. In this manner, the balanced signal may be converted to an unbalanced signal suitable for transmission via the antenna 121.

In various other embodiments of the invention, a signal may be received via the antenna 121 and the switches 211a and 211b may be configured to impedance match the received signal to downstream circuitry, convert the received signal to a differential representation, or bypass the balun 112.

Figure 3:
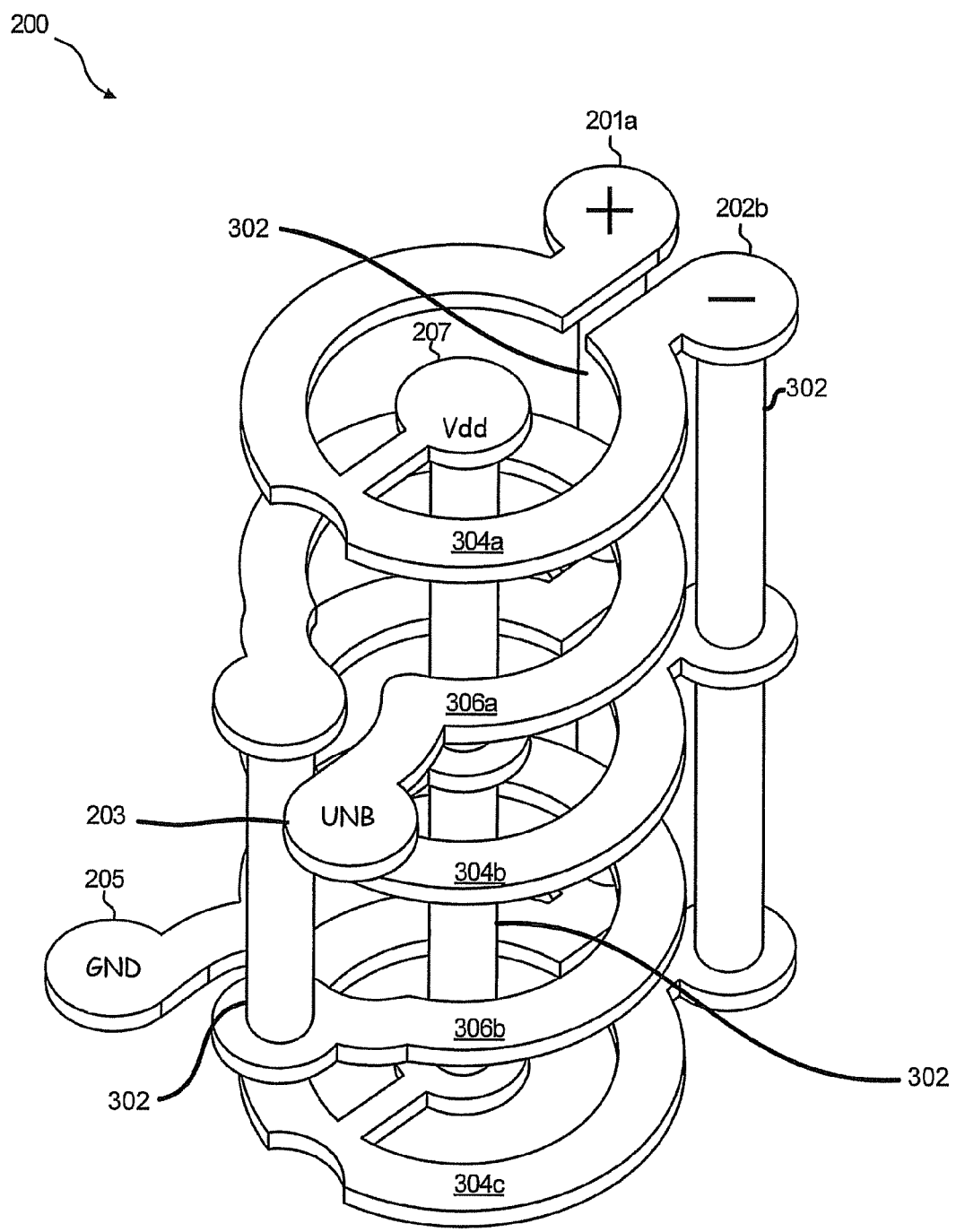
FIG. 3 is a diagram illustrating an exemplary multi-layer balun, in accordance with an embodiment of the invention.

FIG. 3 is a diagram illustrating an exemplary multi-layer balun, in accordance with an embodiment of the invention. Referring to FIG. 3, there is shown the balun 200 comprising a plurality of conductive loops 304a, 306a, 304b, 306b, and 304c arranged in a vertical stack and communicatively coupled via a plurality of vias 302. The input terminals 201A and 201B, the DC bias tap 207, and the output terminals 203 and 205 may be as described with respect to FIG. 2.

In an exemplary embodiment of the invention, a primary winding of the balun 200 may comprise the loops 304a, 304b, and 304c and a secondary winding may comprise the loops 306a and 306b. In this regard, the integrated circuit may comprise at least five metal layers, as described with respect to FIG. 4. Also, in various embodiments of the invention, the integrated circuit may be communicatively coupled to a multi-layer package. In this regard, the integrated circuit may be coupled to the package via a flip-chip bonding technique to reduce stray impedances. Additionally, in various embodiments of the invention, ferromagnetic material may be deposited in and/or on the integrated circuit 200 to improve the magnetic coupling of the loops in the balun 200.

In an exemplary embodiment of the invention, the balun 200 may be suited for processing signals in the 61-61.5 GHZ industrial, scientific, and medical (ISM) band. In this regard, the inductive loops 304 and 306 may be fabricated utilizing transmission line media such as stripline and/or microstrip.

In operation, a differential RF signal may be converted to a single ended signal by the balun 200. The differential signal may be communicatively coupled to the input terminals 201a and 201b via one or more metal layers and/or vias in the integrated circuit, as described with respect to FIG. 3.

Figure 4:
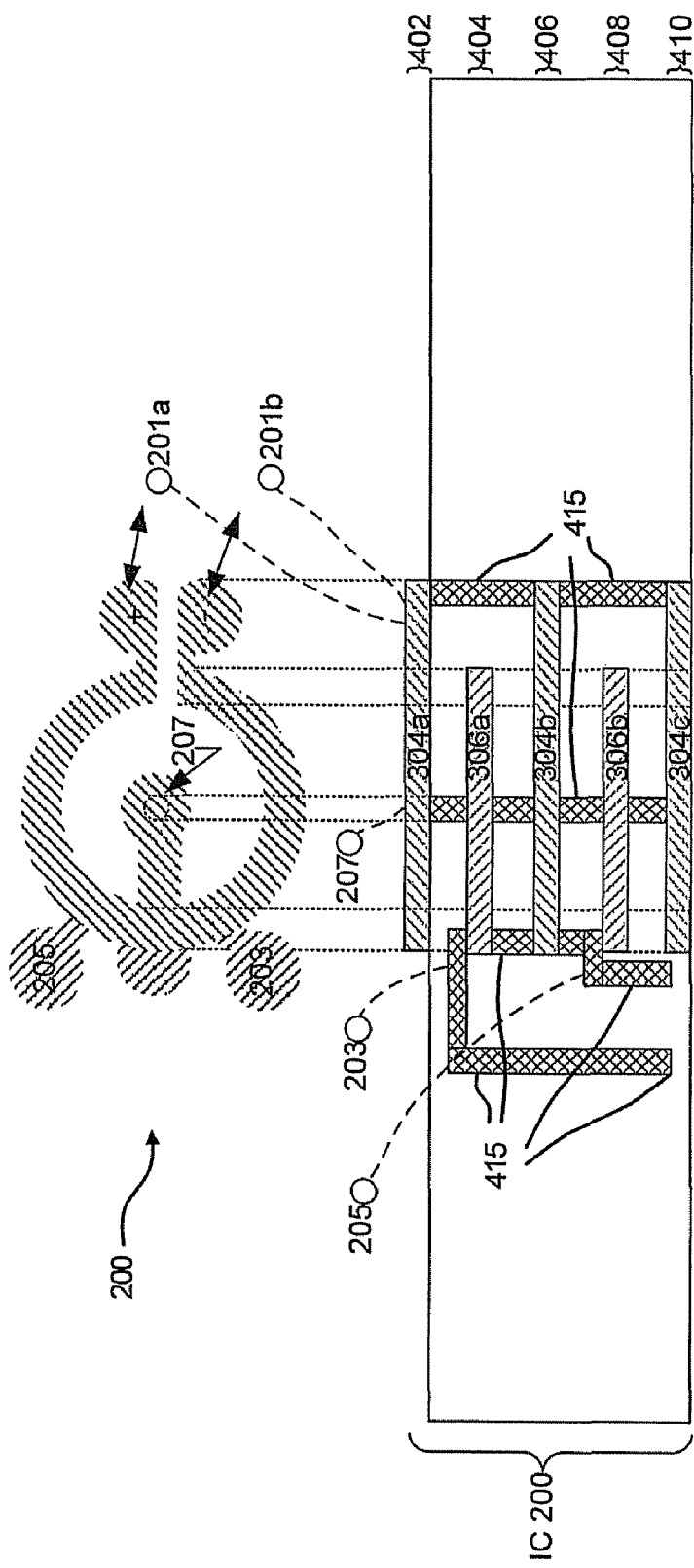
FIG. 4 is a diagram illustrating a cross-sectional view of a balun fabricated in an integrated circuit, in accordance with an embodiment of the invention.

FIG. 4 is a diagram illustrating a cross-sectional view of a balun fabricated in an integrated circuit, in accordance with an embodiment of the invention. Referring to FIG. 4, there is shown an integrated circuit 200, metal layers 402, 404, 406, 408 and 410, and interconnect 415. There is also shown the + and − balanced inputs 201A and 201B, the unbalanced output 203, the ground output 205, and the DC bias tap 207.

The integrated circuit 200 may, for example, comprise the transceiver 123 described with respect to FIG. 1, or may also comprise any other integrated circuit within the wireless device 120 that may require conversion between single ended and differential signaling. The chip 401 may be bump-bonded or flip-chip bonded to a multi-layer package via one or more solder balls. In this manner, wire bonds coupling the chip 200 to a multi-layer package may be eliminated, reducing and/or eliminating stray inductances due to wire bonds. In addition, the thermal conductance out of the chip 200 may be greatly improved utilizing solder balls and thermal epoxy. Thermal epoxy may be electrically insulating but thermally conductive to allow for thermal energy to be conducted out of the chip 200 to the much larger thermal mass of a multilayer package.

The loops 304a, 306a, 304b, 306b, and 304c, as described with respect to FIG. 3, may be fabricated in the metal layers 402, 404, 406, 408, and 410, respectively. The metal layers may comprise transmission line media such as strip-line and/or microstrip. In an exemplary embodiment of the invention, the metal layers 402, 404, 406, 408, and 410 may comprise ferromagnetic and/or ferrimagnetic materials utilized to improve magnetic coupling magnetic devices such as transformers, inductors, baluns, isolators, circulators, and gyrators. The magnetic materials may be deposited on the top, bottom and/or embedded within the integrated circuit 200.

The interconnects 415 may comprise traces embedded in and/or deposited on the integrated circuit 200 that may be utilized as electrically conductive paths in the balun 200 and also to/from the balun 200 and other portions of the integrated circuit 200. Various embodiments of the invention may comprise fewer and/or additional interconnects 415, and thus the invention may not be limited to the number shown in FIG. 4.

In an exemplary embodiment of the invention, the integrated circuit 200 may comprise an RF front end, such as the RF transceiver 123, described with respect to FIG. 1, and may be utilized to transmit and receive RF signals. Additionally, the balun 200 may be configured, via one or more switches as described with respect to FIG. 2, to perform differential to single ended conversion. For example, a balanced signal from a power amplifier may be communicatively coupled to the input terminals 201a and 201b via the metal layer 402 and/or one or more interconnects 415. Accordingly, the balun 200 may convert the balanced signal into an unbalanced signal and may output the unbalanced signal to an antenna by way of the metal layers 404 and 408 and one or more interconnects 415.

Figure 5:
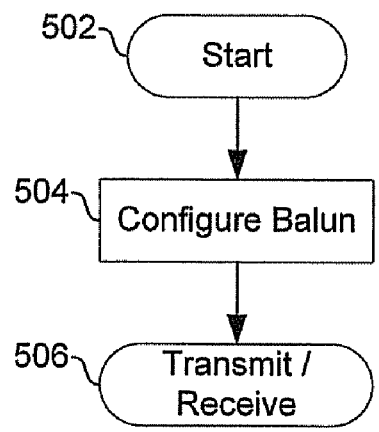
FIG. 5 is a flow chart illustrating exemplary steps for converting between unbalanced and balanced signaling via an integrated balun, in accordance with an embodiment of the invention.

FIG. 5 is a flow chart illustrating exemplary steps for converting between unbalanced and balanced signaling via an integrated balun, in accordance with an embodiment of the invention. Referring to FIG. 5, subsequent to start step 502, the exemplary steps may advance to step 504. In step 504, the balun 200 of FIG. 2 may be configured via one or more switching elements. For example, the balun 20 may be configured based on whether signals are to be received or transmitted via the antenna 121. In an exemplary embodiment of the invention, the balun 200 may communicatively couple the antenna 121 to a unbalanced input of a low noise amplifier for reception and to a balanced output of a power amplifier for transmission. Subsequent to step 504, the exemplary steps may advance to step 506. In step 506, a signal may be transmitted and/or received via the balun 200 and an associated antenna.

Aspects of a method and system for configurable differential or single-ended signaling in an integrated circuit. In this regard, a balun, such as the balun 112, comprising one or more loops fabricated in a plurality of metal layers in an integrated circuit, such as the IC 200, may enable conversion between unbalanced and balanced signals. In this regard, balanced signal output by a transmitter, such as the transmitter 123a, may be converted to a balanced signal for transmission via an antenna, such as the antenna 121. Similarly, an unbalanced signal received by the antenna 121 may be converted to a balanced signal for amplification by a receiver, such as the receiver 123b, with a balanced input. The loops may be fabricated in transmission line media such as microstrip and/or stripline. The loops may comprise ferromagnetic material which may be deposited on and/or within the IC. Signals converted via the balun may be in the 61 GHz-61.5 GHz ISM band.

Another embodiment of the invention may provide a machine-readable storage, having stored thereon, a computer program having at least one code section executable by a machine, thereby causing the machine to perform the steps as described herein for configurable differential or single-ended signaling in an integrated circuit.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
  receiving one of an unbalanced signal and a balanced signal;
  if the unbalanced signal is received, utilizing one or more switches to select between:
    balancing the unbalanced signal via a configurable balun, wherein the configurable balun comprises a plurality of inductive loops fabricated in a plurality of metal layers of an integrated circuit; and
    bypassing the configurable balun such that the unbalanced signal remains unbalanced; and
  if the balanced signal is received, unbalancing the balanced signal via the configurable balun.

2. The method according to claim 1, wherein the balanced signal is received from an amplifier in the integrated circuit.

3. The method according to claim 2, comprising transmitting the unbalanced signal via an antenna communicatively coupled to the balun.

4. The method according to claim 1, wherein the unbalanced signal is received via an antenna communicatively coupled to the integrated circuit.

5. The method according to claim 1, wherein ferromagnetic material is deposited on and/or within the integrated circuit, and the ferromagnetic material improves magnetic coupling in the balun.

6. The method according to claim 1, comprising converting, via said balun, signals in the 61 GHz-61.5 GHz industrial, scientific, and medical frequency band.

7. The method according to claim 1, wherein the inductive loops are fabricated in transmission line media.

8. The method according to claim 7, wherein the transmission line media comprises microstrip.

9. The method according to claim 7, wherein the transmission line media comprises stripline.

10. A system for signal processing, the system comprising:
  a configurable balun comprising a plurality of inductive loops fabricated in a plurality of metal layers of an integrated circuit; and
  a circuit that enables selection, via one or more switches, between:
    unbalancing a balanced signal via the configurable balun;
    balancing an unbalanced signal via the configurable balun; and
    bypassing the configurable balun such that the unbalanced signal remains unbalanced.

11. The system according to claim 10, wherein the circuit enables conversion of a balanced signal output by an amplifier in the integrated circuit to a unbalanced signal.

12. The system according to claim 11, wherein the unbalanced signal is transmitted via an antenna.

13. The system according to claim 10, wherein the circuits enables conversion of an unbalanced signal, received via an antenna communicatively coupled to the integrated circuit, to a balanced signal.

14. The system according to claim 10, wherein the inductive loops comprise ferromagnetic material.

15. The system according to claim 10, wherein ferromagnetic material is deposited on and/or within the integrated circuit, and the ferromagnetic material improves magnetic coupling in the balun.

16. The system according to claim 10, wherein the circuit enables converting signals in the 61 GHz-61.5 GHz industrial, scientific, and medical frequency band.

17. The system according to claim 10, wherein the inductive loops are fabricated in transmission line media.

18. The system according to claim 17, wherein the transmission line media comprises microstrip.

19. The system according to claim 17, wherein the transmission line media comprises stripline.

20. An integrated circuit for signal processing, the integrated circuit comprising:
  an amplifier operable to generate one of an unbalanced signal and a balanced signal;
  a configurable balun coupled to the amplifier and comprising a plurality of inductive loops fabricated in a plurality of metal layers of the integrated circuit; and
  a circuit that enables selection, via one or more switches, between:
    unbalancing the balanced signal via the configurable balun;
    balancing the unbalanced signal via the configurable balun; and
    bypassing the configurable balun such that the unbalanced signal remains unbalanced.

* * * * *